United States Patent
Dulkin et al.

(10) Patent No.: US 7,645,696 B1
(45) Date of Patent: Jan. 12, 2010

(54) DEPOSITION OF THIN CONTINUOUS PVD SEED LAYERS HAVING IMPROVED ADHESION TO THE BARRIER LAYER

(75) Inventors: Alexander Dulkin, Sunnyvale, CA (US); Anil Vijayendran, San Jose, CA (US); Tom Yu, Santa Clara, CA (US); Daniel R. Juliano, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 276 days.

(21) Appl. No.: 11/473,618

(22) Filed: Jun. 22, 2006

(51) Int. Cl.
*H01L 21/00* (2006.01)

(52) U.S. Cl. .................. 438/637; 438/653; 438/672; 438/687; 438/695; 438/760; 257/E21.169; 257/E21.171; 257/E21.582; 257/E21.584; 257/E21.592

(58) Field of Classification Search .......... 438/629, 438/622, 636, 722, 734, 637–695, 760, 765, 438/772, 774, 776; 257/E21.576, 579, E21.169, 257/171, 175, 582–585, 592
See application file for complete search history.

(56) References Cited

U.S. PATENT DOCUMENTS

| | | |
|---|---|---|
| 4,058,430 A | 11/1977 | Suntola et al. |
| 4,492,620 A | 1/1985 | Matsuo et al. |
| 4,588,490 A | 5/1986 | Cuomo et al. |
| 4,609,903 A | 9/1986 | Toyokura et al. |
| 4,622,121 A | 11/1986 | Wegmann et al. |
| 4,737,384 A | 4/1988 | Murthy et al. |
| 4,874,493 A | 10/1989 | Pan |
| 4,999,096 A | 3/1991 | Nihei et al. |
| 5,009,963 A | 4/1991 | Ohmi et al. |
| 5,084,412 A | 1/1992 | Nakasaki |
| 5,139,825 A | 8/1992 | Gordon et al. |
| 5,178,739 A | 1/1993 | Barnes et al. |

(Continued)

FOREIGN PATENT DOCUMENTS

EP   0 692 551 A1   1/1996

(Continued)

OTHER PUBLICATIONS

Schumacher Products, TDEAT (Tetrakis-diethylamino Titanium), Electronic Grade, www.schumacher.com/tdeat.html, printed Jun. 5, 2001, 1 page.

(Continued)

*Primary Examiner*—Michael S Lebentritt
(74) *Attorney, Agent, or Firm*—Weaver Austin Villeneuve & Sampson LLP (57) ABSTRACT

Methods of depositing thin seed layers that improve continuity of the seed layer as well as adhesion to the barrier layer are provided. According to various embodiments, the methods involve performing an etchback operation in the seed deposition chamber prior to depositing the seed layer. The etch step removes barrier layer overhang and/or oxide that has formed on the barrier layer. It some embodiments, a small deposition flux of seed atoms accompanies the sputter etch flux of argon ions, embedding metal atoms into the barrier layer. The embedded metal atoms create nucleation sites for subsequent seed layer deposition, thereby promoting continuous seed layer film growth, film stability and improved seed layer-barrier layer adhesion.

24 Claims, 9 Drawing Sheets

U.S. PATENT DOCUMENTS

| | | | |
|---|---|---|---|
| 5,194,398 A | 3/1993 | Miyachi et al. | |
| 5,221,449 A | 6/1993 | Colgan et al. | |
| 5,281,485 A | 1/1994 | Colgan et al. | |
| 5,298,091 A | 3/1994 | Edwards, III et al. | |
| 5,378,506 A | 1/1995 | Imai et al. | |
| 5,482,611 A | 1/1996 | Helmer et al. | |
| 5,622,608 A | 4/1997 | Lanford et al. | |
| 5,629,221 A | 5/1997 | Chao et al. | |
| 5,654,233 A | 8/1997 | Yu | |
| 5,656,860 A | 8/1997 | Lee | |
| 5,766,379 A | 6/1998 | Lanford et al. | |
| 5,789,027 A | 8/1998 | Watkins et al. | |
| 5,801,089 A * | 9/1998 | Kenney | 438/589 |
| 5,904,565 A | 5/1999 | Nguyen et al. | |
| 5,969,422 A | 10/1999 | Ting et al. | |
| 5,985,762 A * | 11/1999 | Geffken et al. | 438/687 |
| 6,037,257 A | 3/2000 | Chiang et al. | |
| 6,037,258 A * | 3/2000 | Liu et al. | 438/687 |
| 6,046,108 A | 4/2000 | Liu et al. | |
| 6,074,544 A | 6/2000 | Reid et al. | |
| 6,077,780 A | 6/2000 | Dubin | |
| 6,080,285 A | 6/2000 | Liu et al. | |
| 6,093,966 A | 7/2000 | Venkatraman et al. | |
| 6,099,702 A | 8/2000 | Reid et al. | |
| 6,100,200 A | 8/2000 | Van Buskirk et al. | |
| 6,110,346 A | 8/2000 | Reid et al. | |
| 6,114,238 A | 9/2000 | Liao | |
| 6,120,641 A | 9/2000 | Stevens et al. | |
| 6,124,203 A | 9/2000 | Joo et al. | |
| 6,126,798 A | 10/2000 | Reid et al. | |
| 6,139,712 A | 10/2000 | Patton et al. | |
| 6,147,000 A | 11/2000 | You et al. | |
| 6,156,167 A | 12/2000 | Patton et al. | |
| 6,159,354 A | 12/2000 | Contolini et al. | |
| 6,159,857 A | 12/2000 | Liu et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,200,893 B1 | 3/2001 | Sneh | |
| 6,203,613 B1 | 3/2001 | Gates et al. | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,235,163 B1 | 5/2001 | Angelo et al. | |
| 6,249,055 B1 | 6/2001 | Dubin | |
| 6,251,242 B1 | 6/2001 | Fu et al. | |
| 6,271,591 B1 | 8/2001 | Dubin et al. | |
| 6,274,008 B1 | 8/2001 | Gopalraja et al. | |
| 6,277,249 B1 | 8/2001 | Gopalraja et al. | |
| 6,280,597 B1 | 8/2001 | Kashiwada et al. | |
| 6,287,977 B1 | 9/2001 | Hashim et al. | |
| 6,333,547 B1 | 12/2001 | Tanaka et al. | |
| 6,340,435 B1 * | 1/2002 | Bjorkman et al. | 216/72 |
| 6,342,133 B2 | 1/2002 | D'Couto et al. | |
| 6,342,448 B1 | 1/2002 | Lin et al. | |
| 6,350,353 B2 | 2/2002 | Gopalraja et al. | |
| 6,387,805 B2 | 5/2002 | Ding et al. | |
| 6,391,785 B1 | 5/2002 | Satta et al. | |
| 6,395,642 B1 | 5/2002 | Liu et al. | |
| 6,402,907 B1 | 6/2002 | Rich | |
| 6,417,094 B1 | 7/2002 | Zhao et al. | |
| 6,423,200 B1 * | 7/2002 | Hymes | 205/123 |
| 6,440,854 B1 | 8/2002 | Rozbicki | |
| 6,448,176 B1 | 9/2002 | Grill et al. | |
| 6,451,177 B1 * | 9/2002 | Gopalraja et al. | 204/192.12 |
| 6,492,262 B2 | 12/2002 | Uzoh | |
| 6,498,091 B1 | 12/2002 | Chen et al. | |
| 6,500,762 B2 | 12/2002 | Hashim et al. | |
| 6,509,267 B1 * | 1/2003 | Woo et al. | 438/687 |
| 6,518,668 B2 * | 2/2003 | Cohen | 257/751 |
| 6,538,324 B1 | 3/2003 | Tagami et al. | |
| 6,541,374 B1 | 4/2003 | de Felipe et al. | |
| 6,554,914 B1 | 4/2003 | Rozbicki et al. | |
| 6,559,061 B2 * | 5/2003 | Hashim et al. | 438/722 |
| 6,562,715 B1 * | 5/2003 | Chen et al. | 438/643 |
| 6,566,246 B1 | 5/2003 | de Felipe et al. | |
| 6,589,887 B1 | 7/2003 | Dalton et al. | |
| 6,605,534 B1 | 8/2003 | Chung et al. | |
| 6,607,977 B1 | 8/2003 | Rozbicki et al. | |
| 6,607,982 B1 | 8/2003 | Powell et al. | |
| 6,613,199 B1 | 9/2003 | Tobin et al. | |
| 6,642,146 B1 | 11/2003 | Rozbicki et al. | |
| 6,652,718 B1 | 11/2003 | D'Couto et al. | |
| 6,656,841 B1 | 12/2003 | Kim | |
| 6,660,622 B2 * | 12/2003 | Chen et al. | 438/595 |
| 6,673,716 B1 | 1/2004 | D'Couto et al. | |
| 6,706,155 B2 | 3/2004 | Morimoto et al. | |
| 6,709,987 B2 * | 3/2004 | Hashim et al. | 438/722 |
| 6,755,945 B2 | 6/2004 | Yasar et al. | |
| 6,758,947 B2 | 7/2004 | Chiang et al. | |
| 6,764,940 B1 * | 7/2004 | Rozbicki et al. | 438/627 |
| 6,784,096 B2 * | 8/2004 | Chen et al. | 438/637 |
| 6,790,776 B2 * | 9/2004 | Ding et al. | 438/685 |
| 6,841,044 B1 | 1/2005 | Ruzic | |
| 6,893,541 B2 | 5/2005 | Chiang et al. | |
| 6,905,965 B2 | 6/2005 | Subrahmanyan et al. | |
| 6,919,275 B2 | 7/2005 | Chiang et al. | |
| 6,943,111 B2 | 9/2005 | Lin et al. | |
| 6,949,457 B1 | 9/2005 | Fiordalice et al. | |
| 6,969,448 B1 | 11/2005 | Lau | |
| 6,992,012 B2 | 1/2006 | Haskim et al. | |
| 7,030,031 B2 | 4/2006 | Wille et al. | |
| 7,037,830 B1 | 5/2006 | Rumer et al. | |
| 7,048,837 B2 | 5/2006 | Somekh et al. | |
| 7,070,687 B2 * | 7/2006 | Chikarmane et al. | 205/123 |
| 7,074,714 B2 | 7/2006 | Chiang et al. | |
| 7,135,402 B2 | 11/2006 | Lin et al. | |
| 7,186,648 B1 | 3/2007 | Rozbicki et al. | |
| 7,253,109 B2 | 8/2007 | Ding et al. | |
| 7,294,574 B2 | 11/2007 | Ding et al. | |
| 7,365,001 B2 | 4/2008 | Yang et al. | |
| 2002/0000382 A1 | 1/2002 | Morrissey et al. | |
| 2002/0041028 A1 | 4/2002 | Choi et al. | |
| 2002/0110999 A1 | 8/2002 | Lu et al. | |
| 2003/0034244 A1 | 2/2003 | Yasar et al. | |
| 2003/0116427 A1 | 6/2003 | Ding et al. | |
| 2003/0129828 A1 * | 7/2003 | Cohen | 438/629 |
| 2004/0007325 A1 * | 1/2004 | Pan et al. | 156/345.1 |
| 2004/0048461 A1 * | 3/2004 | Chen et al. | 438/629 |
| 2004/0171250 A1 | 9/2004 | Chiang et al. | |
| 2004/0188239 A1 | 9/2004 | Robison et al. | |
| 2004/0211661 A1 | 10/2004 | Zhang et al. | |
| 2005/0006222 A1 | 1/2005 | Ding et al. | |
| 2005/0020080 A1 | 1/2005 | Chiang et al. | |
| 2005/0032382 A1 | 2/2005 | Rossman | |
| 2005/0085068 A1 | 4/2005 | Chiang et al. | |
| 2005/0173239 A1 | 8/2005 | Somekh et al. | |
| 2005/0211545 A1 | 9/2005 | Cerio, Jr. et al. | |
| 2005/0252765 A1 | 11/2005 | Zhang et al. | |
| 2005/0255690 A1 | 11/2005 | Chen et al. | |
| 2005/0255691 A1 | 11/2005 | Ding et al. | |
| 2005/0266682 A1 | 12/2005 | Chen et al. | |
| 2005/0272254 A1 | 12/2005 | Ding et al. | |
| 2006/0014378 A1 | 1/2006 | Aggrawal et al. | |
| 2006/0024953 A1 | 2/2006 | Rao et al. | |
| 2006/0030151 A1 | 2/2006 | Ding et al. | |
| 2006/0057843 A1 | 3/2006 | Chen et al. | |
| 2006/0207873 A1 | 9/2006 | Fu | |
| 2007/0178682 A1 | 8/2007 | Chiang et al. | |
| 2008/0190760 A1 | 8/2008 | Tang et al. | |

2008/0310005 A1  12/2008  Tonar et al.

FOREIGN PATENT DOCUMENTS

JP          11-186273        9/1999

OTHER PUBLICATIONS

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10. mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16-18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Ding et al., "Observation of Reduced Oxidation Rates for Plasma-Assisted CVD Copper Films", Mat. Res. Soc. Symp. Proc., vol. 309, 1993 pp. 445-460.

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics".

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructual Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.

Ding et al., "Effects of the addition of small amounts of Al to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetrakis (dimethylamido)Titanium and Selected N-Containing Precursors on SiO.sub.2," May/Jun. 1998, J. Vac. Sci. Technol., A 16(3), pp. 1262-1267.

Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.

Han et al., "Barrier Metal Properties of Amorphous Tantalum Nitride Thin Films Between Platinum and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Hayden et al., "Characterization of Magnetron-Sputtered Partially Ionized Aluminum Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121 (1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovsky et al., "Formation of Thin Fims by Remote Plasma Enhanced Chemical Vapor Deposition (Remote PECVD)," Feb. 1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, *J. Phys. Chem.*, 1995, 99, pp. 8831-8842.

Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Danek et al., "Barrier First Method for Single Damascene Trench Applications," Novellus Systems, Inc., U.S. Appl. No. 11/714,465, filed Mar. 5, 2007.

U.S. Office Action mailed Jul. 31, 2002, from U.S. Appl. No. 09/862,539.

U.S. Office Action mailed Sep. 16, 2002, from U.S. Appl. No. 09/776,704.

U.S. Office Action mailed Apr. 22, 2002, from U.S. Appl. No. 09/776,704.

U.S. Final Office Action mailed Apr. 3, 2003, from U.S. Appl. No. 09/816,847.

U.S. Office Action mailed Oct. 4, 2002, from U.S. Appl. No. 09/816,847.

U.S. Office Action mailed Oct. 23, 2002, from U.S. Appl. No. 09/965,472.

U.S. Office Action mailed Oct. 3, 2003, from U.S. Appl. No. 10/412,562.

U.S. Final Office Action mailed Mar. 23, 2006, from U.S. Appl. No. 10/804,353.

U.S. Office Action mailed Oct. 3, 2006, from U.S. Appl. No. 10/804,353.

U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Rozbicki et al., "Multistep Method of Depositing Metal Seed Layers," Novellus Systems, Inc., U.S. Appl. No. 11/701,984, filed Feb. 1, 2007.

Pradhan et al., "Atomic Layer Profiling of Diffusion Barrier and Metal See Layers," Novellus Systems, Inc., U.S. Appl. No. 11/807,179, filed May 24, 2007.

Juliano, D., "Selective Resputtering of Metal Seed Layers," Novellus Systems, Inc., U.S. Appl. No. 11/903,487, filed Sep. 21, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during $Cl_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J.Vac. Sci. Technol. B 16(4), Jul./Aug. 1998, pp. 2102-2104.

Lane et al., "Feature evolution during plasma etching. II. Polycrystalline silicone etching," J.Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/807,182, filed May 24, 2007.

Kinder et al., "The Use of a Ultra-High Magnetic Fields in Resputter and Plasma Etching," Novellus Systems, Inc., U.S. Appl. No. 11/807,183, filed May 24, 2007.

Dulkin et al., "Methods and Apparatus for Engineering and Interface Between A Diffusion Barrier Layer and A Seed Layer," Novellus Systems, Inc., U.S. Appl. No. 11/807,178, filed May 24, 2007.

U.S. Office Action mailed Dec. 12, 2008, from U.S. Appl. No. 11/714,465.

Notice of Allowance and Fee Due mailed Nov. 24, 2008, from U.S. Appl. No. 11/558,693.

Allowed Claims from U.S. Appl. No. 11/558,693.

U.S. Office Action mailed Nov. 14, 2008, from U.S. Appl. No. 11/701,984.

Notice of Allowance and Fee Due mailed Apr. 13, 2004, from U.S. Appl. No. 10/412,562.

Allowed Claims from U.S. Appl. No. 10/412,562.

Notice of Allowance and Fee Due mailed Oct. 3, 2006, from U.S. Appl. No. 10/804,353.

Allowed Claims from U.S. Appl. No. 10/804,353.

Wu et al., "Methods and Apparatus for Depositing Titanium Based Diffusion Barrier Films," Novellus Systems, Inc., U.S. Appl. No. 12/154,984, filed May 28, 2008.

U.S. Office Action mailed on Mar. 6, 2009 for U.S. Appl. No. 11/903,487.

U.S. Office Action mailed on Feb. 23, 2009 for U.S. Appl. No. 11/701,984.

U.S. Office Action mailed on Mar. 24, 2009 for U.S. Appl. No. 11/473,618.

U.S. Office Action mailed on May 5, 2009 for U.S. Appl. No. 11/588,586.

Notice of Allowance and Fee Due mailed Jun. 17, 2009 for U.S. Appl. No. 11/888,323.

U.S. Final Office Action mailed Jun. 17, 2009 for U.S. Appl. No. 11/701,984.

Wu et al., "Deposition of Doped Copper Seed Layers Having Improved Reliability," Novellus Systems, Inc., U.S. Appl. No. 12/122,118, filed May 16, 2008.

U.S. Office Action mailed May 2, 2008, from U.S. Appl. No. 11/558,693.

\* cited by examiner

DEPOSITION OF THIN CONTINUOUS PVD SEED LAYERS HAVING IMPROVED ADHESION TO THE BARRIER LAYER

FIELD OF THE INVENTION

The present invention pertains to methods for forming a metal seed layer on a barrier layer of a partially fabricated integrated circuit.

BACKGROUND OF THE INVENTION

Damascene processing is a method for forming interconnections on integrated circuits that involves formation of inlaid metal lines in trenches and vias formed in a dielectric layer (inter-metal dielectric). The metal conductive lines are formed by an electroplating process. Because copper or other mobile conductive material provides the conductive paths of the integrated circuit, the underlying silicon devices must be protected from metal ions (e.g., $Cu^{2+}$) that might otherwise diffuse or drift into the silicon. Suitable materials for diffusion barrier include tantalum, tantalum nitride, tungsten, titanium tungsten, titanium nitride, tungsten nitride, and the like.

After diffusion barrier is deposited and prior to electroplating, a seed layer of copper or other metal is typically applied by a physical vapor deposition (PVD) process to enable subsequent electrofilling of the features with copper inlay. In order to serve as a seed for electroplating, the seed layer should be continuous, stable and have good adhesion to the barrier layer.

One difficulty with depositing seed layers is that the copper (or other metal) may agglomerate on the barrier layer surface. This phenomenon occurs because of the weak chemical bond between seed and the barrier as a result of the absence of an intermetallic reaction between the two. High oxidation ability of the barrier aggravates this phenomenon. Because of this agglomeration, the copper may not cover the surface in a conformal manner. The thickness of the seed layer coverage is thus uneven, thicker in some places than others, and the layer may include gaps. Such seed layers do not provide a uniform layer for electroplating, which leads to voiding defects in the electroplated copper. Another difficulty is the formation of "overhang" material on the edges of the features. Diffusion barrier overhang, for example, can prevent seed metal deposition flux from reaching the top sidewalls of the features. This phenomenon also leads to seed layers having poor continuity. Defects, poor continuity and poor adhesion of the seed layer all may adversely affect performance of the fabricated device. For example, defects in the seed layer may result in electromigration and stress migration at the seed-barrier interface. Void formation in the electrofilled copper features and subsequent post CMP defects are other consequences of poor seed layer formation that may also lead to device failure.

What are therefore needed are methods of depositing metal seed layers on diffusion barriers that provide seed layers having improved continuity and adhesion to the underlying diffusion barrier.

SUMMARY OF THE INVENTION

The present invention meets these needs by providing methods of depositing seed layers that improve continuity of the seed layer as well as adhesion to the barrier layer. According to various embodiments, the methods involve performing a sputter etch in the seed deposition chamber prior to depositing the seed layer. The etch step removes barrier layer overhang and/or oxide that has formed on the barrier layer. In some embodiments, a small deposition flux accompanies the sputter etch flux, embedding metal atoms into the barrier layer. The embedded metal atoms create nucleation sites for subsequent seed layer deposition, thereby promoting continuous seed layer film growth, film stability and improved seed layer-barrier layer adhesion.

One aspect of the invention relates to a method of depositing a metal conductive seed layer on a substrate that involves the operations of a) providing a substrate having a barrier layer deposited thereon to a seed layer deposition chamber; b) performing an inert gas sputter etch of the barrier layer in the seed layer deposition chamber; and c) depositing the metal conductive seed layer over the surface of the wafer substrate in the seed layer deposition chamber.

According to various embodiments, the sputter etch operation may remove barrier material that overhangs a recessed feature (e.g., a trench or via) on the substrate and/or remove oxide that has formed on the barrier layer. In some embodiments, the method involves simultaneously sputtering metal from a target while performing the sputter etch of the barrier material. The metal atoms may then become embedded in the barrier layer surface to provide nucleation sites for the seed layer deposition in (c). In certain embodiments performing operation (b) involves applying a DC power of between about 0 and 10 kW to the target and a RF power of at least about 100 W, e.g. between about 100 and 3000 W, to the substrate.

Another aspect of the invention relates to a method of depositing a metal seed layer on a semiconductor substrate having recessed features that involves a) providing the substrate with a barrier layer deposited thereon to the seed layer deposition chamber; b) applying a DC power to a metal target within the chamber and a RF bias to the substrate to simultaneously etch barrier layer oxide and implant metal atoms into the barrier layer; and c) applying a DC power to the metal target to deposit a metal seed layer that substantially coats the sidewalls of the features, wherein the implanted atoms are nucleation sites for the deposition of the metal.

These and other features and advantages of the present invention will be described in more detail below with reference to the associated drawings.

BRIEF DESCRIPTION OF THE DRAWINGS

FIGS. 2A-D shows cross sectional depictions of barrier layer overhang of a feature and resulting metal seed film and electrofilled feature. FIG. 2A depicts the cross sectional depiction of barrier layer overhang.

FIGS. 5A and 5B are images of a structure having a barrier layer deposited thereon.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the term "wafer" will be used interchangeably with "partially fabricated integrated circuit." One skilled in the art would understand that the term "partially fabricated integrated circuit" can refer to a silicon wafer during any of many stages of integrated circuit fabrication thereon. The term "substrate" is also used and includes wafers.

This invention relates to deposition of metal seed layers on diffusion barrier layers. Methods of the invention involve performing a sputter etch operation (also referred to as an etchback operation) in the seed deposition module prior to deposition of the seed layer. According to various embodiments, the sputter etch operation results in one or more of the following: 1) reduction or elimination of oxide formed on the barrier, 2) reduction or elimination of barrier layer overhang at the tops of features, and 3) activation of the barrier surface before seed deposition (e.g., by creating nucleation sites).

Advantages of reducing barrier layer overhang include reduction or elimination of subsequent seed overhang, decrease of preplating aspect ratio, reduction of barrier layer thickness variation within the features and between features, and reduction of copper seed thickness variation within the features and between features. This leads to void free electroplating and reduction in post CMP defects. Advantages of reducing barrier oxide include improved seed-barrier adhesion and reducing line and contact resistance. Advantages of creation of nucleation sites in the barrier layer include increased nucleation density, improved seed layer morphology, improved seed layer continuity and improved seed-barrier adhesion. Improved film continuity and adhesion reduces electromigration along the barrier/seed interface, as well as stress migration. This in turn improves device reliability. The sputter etch or etchback operation also decreases barrier layer roughness, especially on sidewalls, which in turn improves the continuity and smoothness of the seed layer.

Figure 1A:
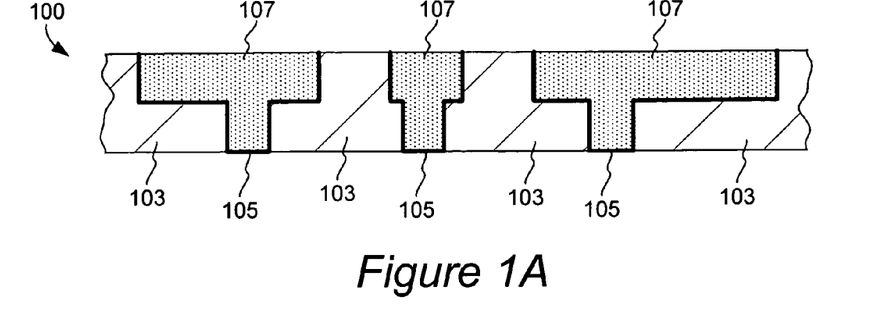
FIGS. 1A-1H show cross sectional depictions of device structures created during a dual Damascene fabrication process.

As mentioned, the invention finds particular use in Damascene processing. FIGS. 1A-1F show cross sectional depictions of device structures created at various stages of a dual Damascene fabrication process, with the cross sectional depiction of a completed structure created by the dual Damascene process is shown in FIG. 1H. Referring to FIG. 1A, an example of a typical substrate, 100, used for dual Damascene fabrication is illustrated. Substrate 100 includes a pre-formed dielectric layer 103 (such as fluorine or carbon doped silicon dioxide or organic-containing low-k materials) with etched line paths (trenches and vias) in which a diffusion barrier 105 has been deposited followed by inlaying with copper conductive routes 107. Because copper or other mobile conductive material provides the conductive paths of the integrated circuit, the underlying silicon devices must be protected from metal ions (e.g., $Cu^{2+}$) that might otherwise diffuse or drift into the silicon. For purposes of discussion, this application may refer to copper conductive lines and seed layers; however one of skill in the art will understand that methods of the invention may be applied to seed layer deposition of other types of conductive materials (e.g., aluminum).

Suitable materials for diffusion barrier 105 include tantalum, tantalum nitride, tungsten, titanium tungsten, titanium nitride, tungsten nitride, and the like. In a typical process, barrier 105 is formed by a physical vapor deposition (PVD) process such as sputtering, a chemical vapor deposition (CVD) process, or an atomic layer deposition (ALD) process. Typical metals for the conductive routes are aluminum and copper. More frequently, copper serves as the metal in Damascene processes, as depicted in these figures. The resultant partially fabricated integrated circuit 100 is a representative substrate for subsequent Damascene processing, as depicted in FIGS. 1B-1H.

Figure 1B:
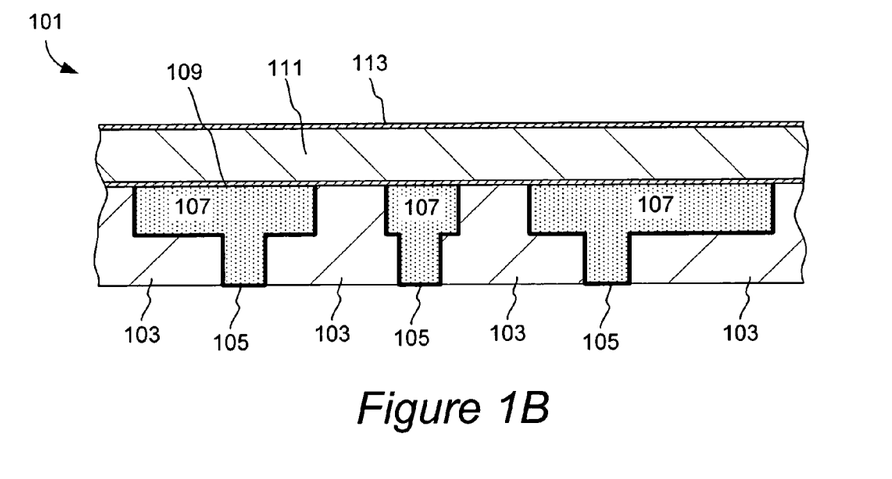

As depicted in FIG. 1B, a silicon nitride or silicon carbide diffusion barrier 109 is deposited to encapsulate conductive routes 107. Next, a first dielectric layer, 111, of a dual Damascene dielectric structure is deposited on diffusion barrier 109. This is followed by deposition of an etch-stop layer 113 (typically composed of silicon nitride or silicon carbide) on the first dielectric layer 111.

Figure 1C:
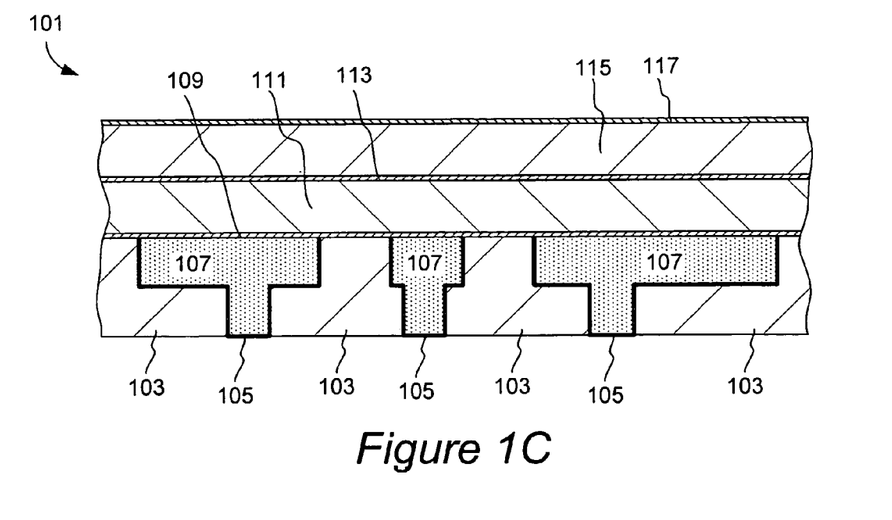

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically a silicon oxynitride, follows.

Figure 1D:
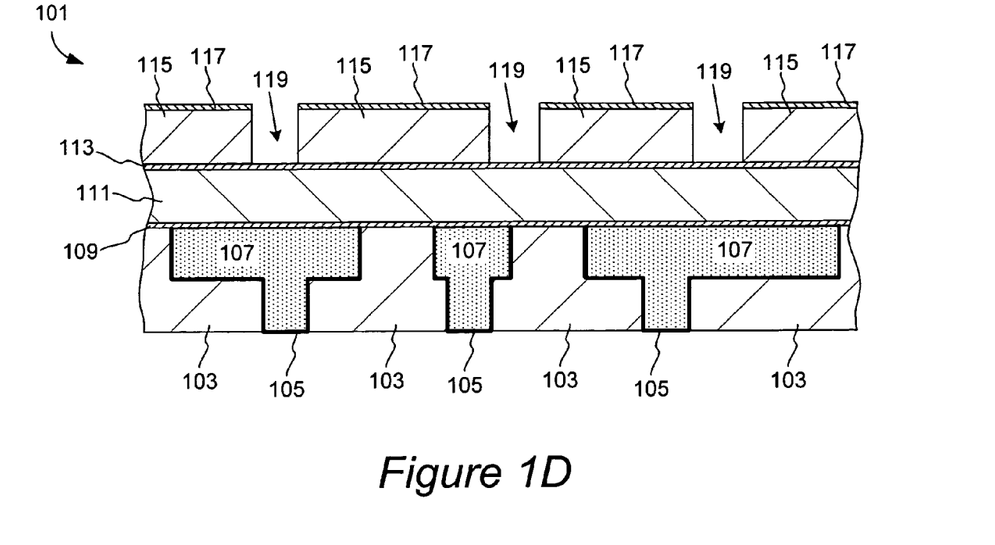
Figure 1E:
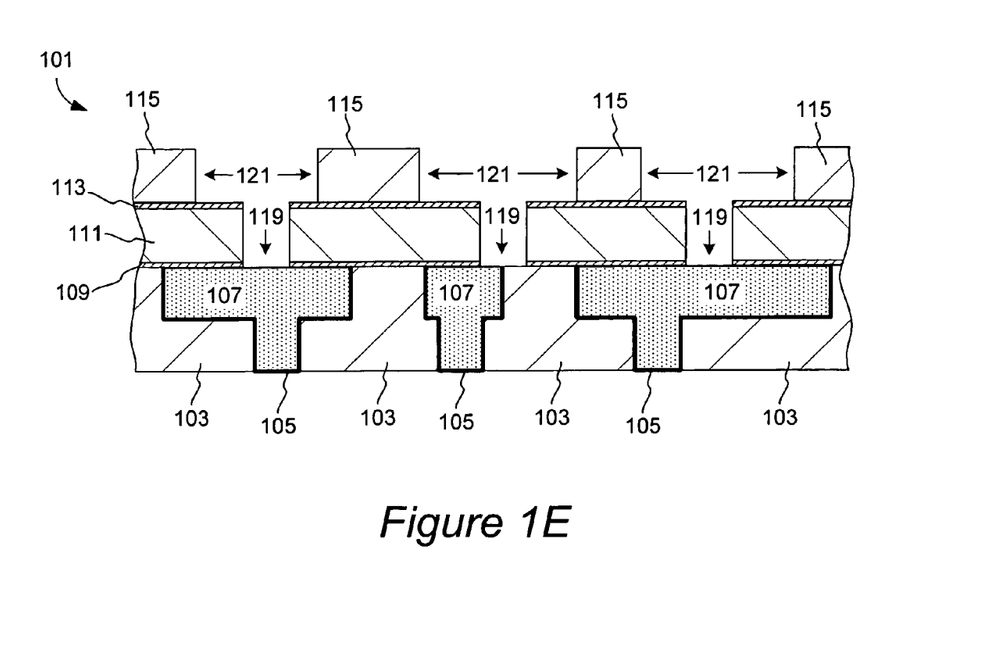

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
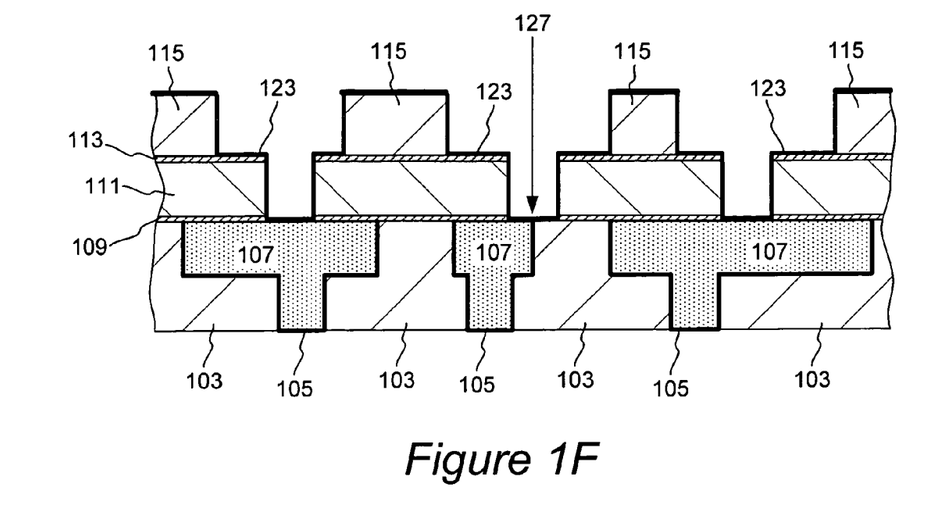

Next, as depicted in FIG. 1F, these newly formed vias and trenches are, as described above, coated with a diffusion barrier 123. As mentioned above, barrier 123 is made of tantalum, or other materials that effectively block diffusion of copper atoms into the dielectric layers.

Figure 1G:
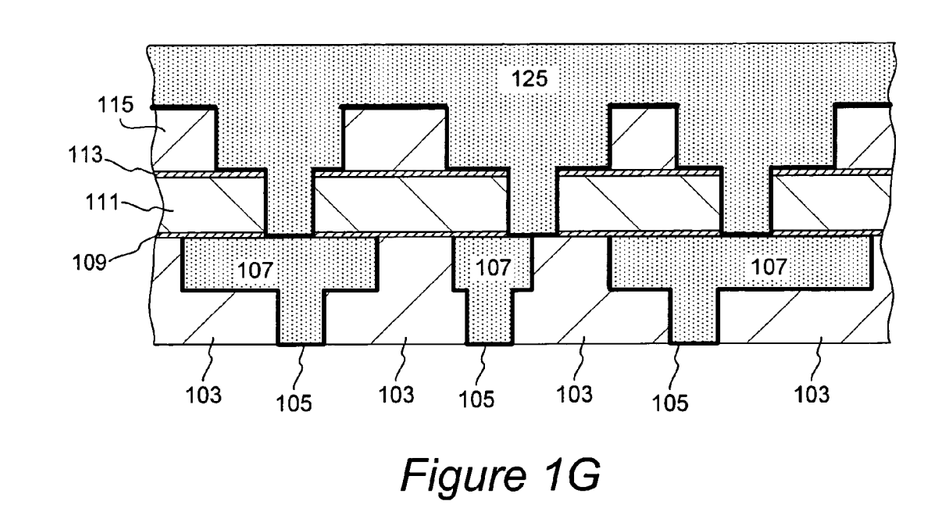
Figure 1H:
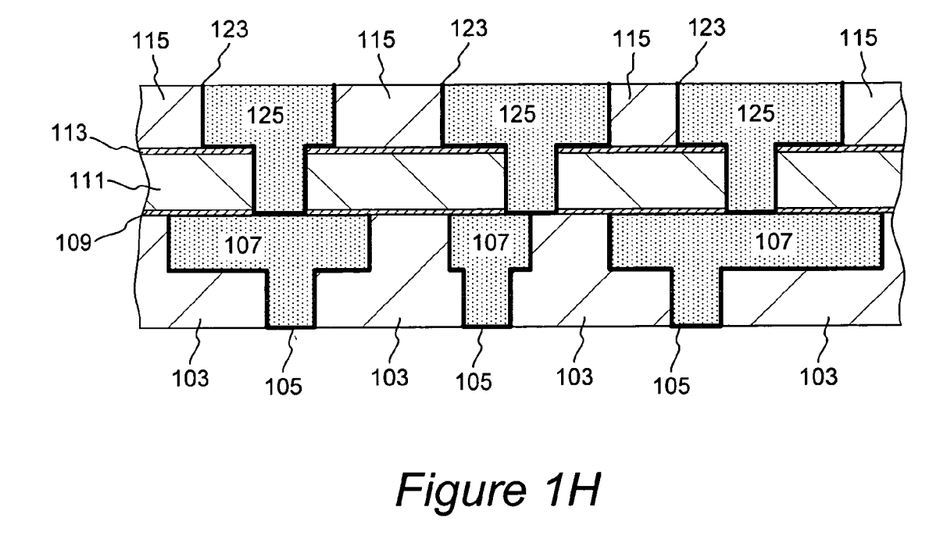

After diffusion barrier 123 is deposited, a seed layer of copper is deposited to enable subsequent electrofilling of the features with copper inlay 125 as shown on FIG. 1G. The blanket layer of electrodeposited copper is removed by chemical mechanical polishing (CMP) leaving the conductive material only inside the features. FIG. 1H shows the completed dual Damascene process, in which copper conductive routes 125 are inlayed (seed layer not depicted) into the via and trench surfaces over barrier 123.

Copper routes 125 and 107 are now in electrical contact and form conductive pathways, as they are separated only by diffusion barrier 123, which is also somewhat conductive.

As indicated above, the present invention relates to deposition of seed layers on diffusion barriers. Although FIGS. 1A-1H illustrate a dual Damascene process, one of skill in the art will recognize that the methods of the present invention may be used with other process flows, including single Damascene processes.

Diffusion barriers may be deposited by PVD, CVD or ALD methods. PVD methods result in high quality films, though conformal methods, including ionized-PVD (iPVD), CVD and ALD methods may be used to improve step coverage of the recessed features and reduce overhang of barrier material on the top edges of the features. Regardless of the method used to deposit the diffusion barrier, subsequent barrier oxide formation may significantly and adversely affect copper seed deposition. Barriers, such as tantalum-based barriers, readily oxidize. Even in a high vacuum environment, the time it takes to move the barrier-coated wafer from one module to another (e.g., from a PVD barrier module to a PVD copper seed module) is enough for oxygen to attach itself to the any free Ta bonds (or other barrier material) on the barrier layer surface. The barrier oxide bonds may be strong, thereby making the barrier less attractive to the metal seed layer. The resulting poor adhesion and film discontinuities may result in instability of the seed layer in the plating bath.

Figure 2A:
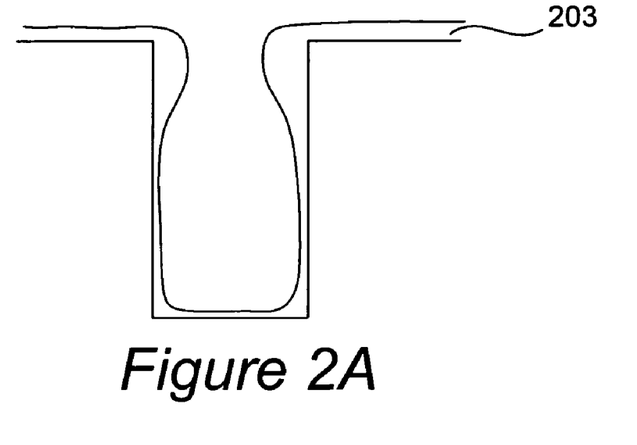
Figure 2B:
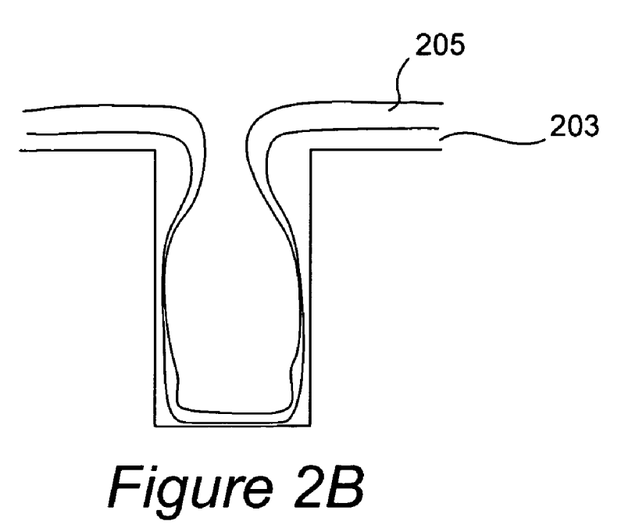
FIG. 2B depicts the subsequently deposited metal seed layer.
Figure 2C:
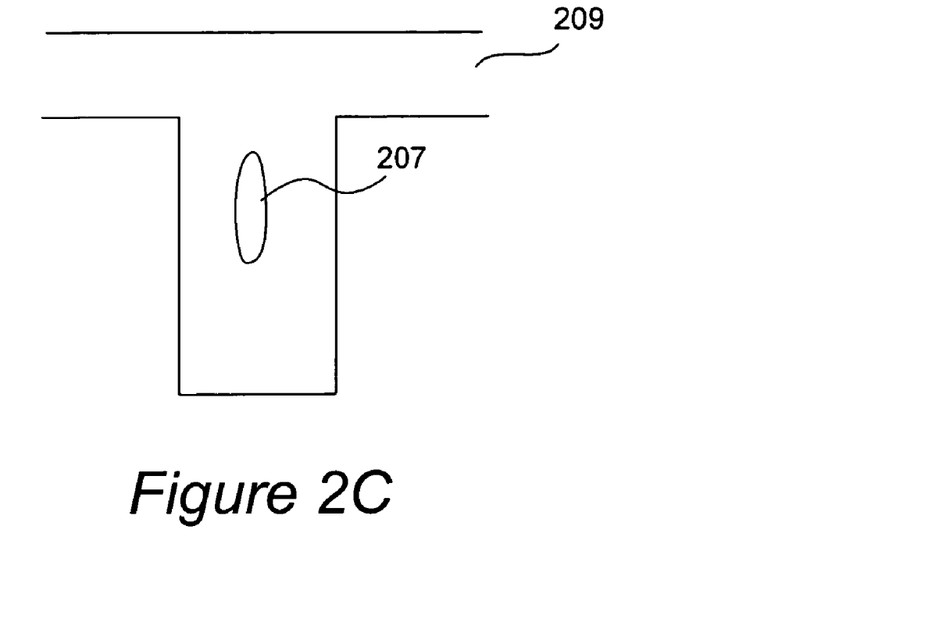
FIGS. 2C and 2D depicts the electrofilled feature containing various types of voids.
Figure 2D:
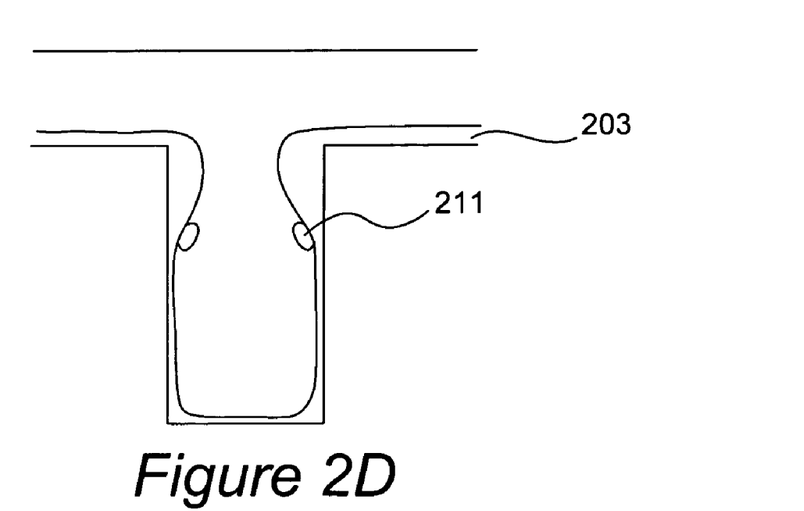

As indicated, barrier deposition, especially PVD barrier deposition, may result in barrier material overhang. FIG. 2A shows an example of a diffusion barrier 203 in which material overhangs a recessed feature. Diffusion barrier overhang results in poor sidewall coverage for the subsequent metal seed layer deposition, because it effectively filters the deposition flux having incident angles that reach the sidewall. This overhang results in metal seed layer overhang and prevents metal seed deposition on the sidewall from the beginning of the deposition process. An example of this is shown in FIG. 2B, in which seed layer 205 also overhangs the feature and is thin and/or has gaps in coverage along the sidewall due to the barrier layer overhang. Overhang of the seed layer can lead to void formation as the electroplated metal closes off the feature at the opening before the feature is filled. FIG. 2C illustrates this, showing void 207 in the electroplated metal 209 (barrier and seed layers are not depicted in FIG. 2C). Voids may lead to improper operation and/or device breakdown. The smaller the feature opening is before electrofilling, the more likely that voids will be present. The other highly probable place for void formation is immediately underneath the barrier overhang, where seed to barrier adhesion is compromised due to lack of seed coverage. FIG. 2D shows voids 211 under barrier layer 203. These voids might serve as the nucleation sites for stress migration failures and/or post CMP defects.

Figure 3:
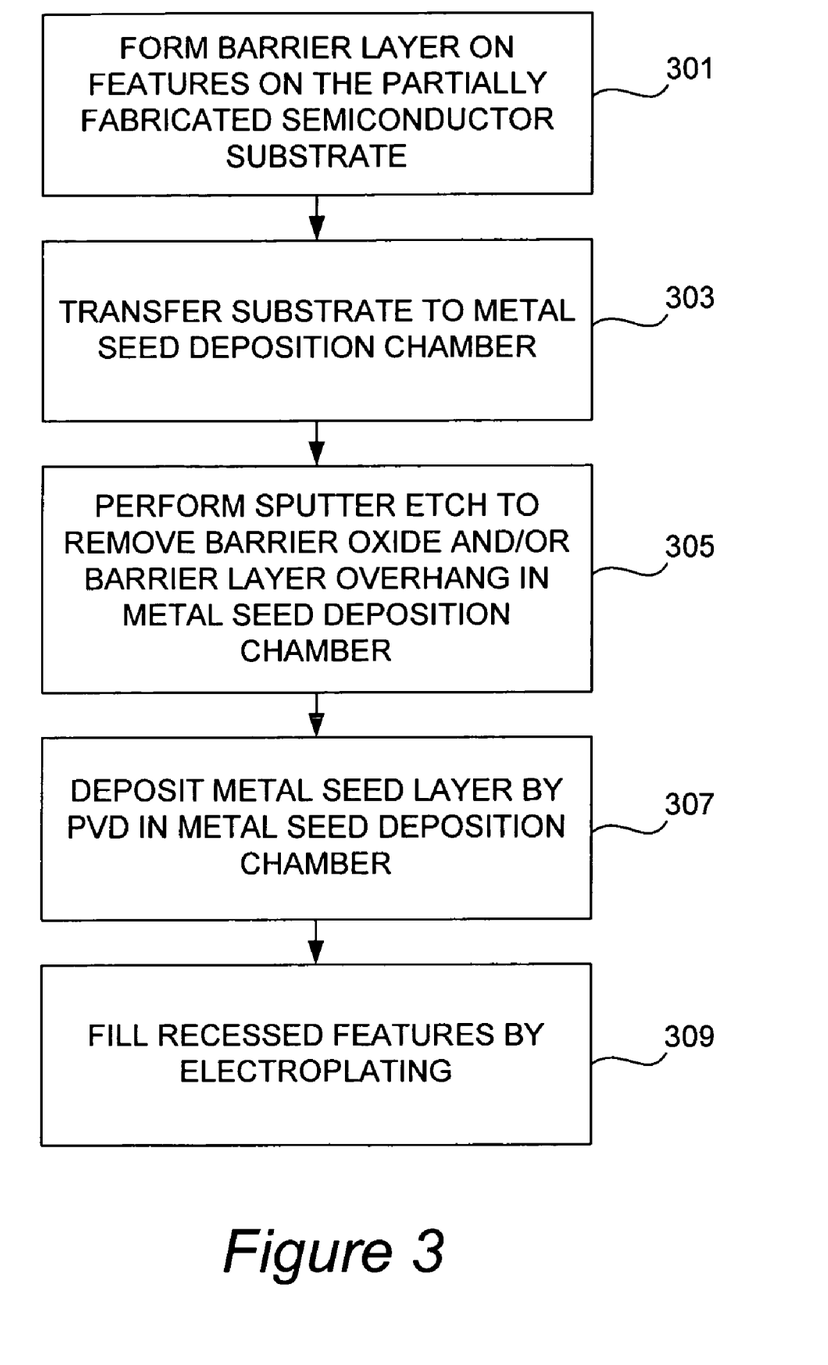
FIG. 3 is a process flow diagram illustrating relevant operations employed to form conductive lines by Damascene processing according to various embodiments of the present invention.

The methods of the present invention provide improved methods of forming metal seed layers on diffusion barriers. FIG. 3 is a process flow diagram illustrating relevant operations employed to form conductive lines by Damascene processing according to various embodiments of the present invention.

The process begins at operation 301 in which a barrier layer is formed on features on the partially fabricated semiconductor substrate. Various processing operations, as described above in the context of FIGS. 1A-1H, may have been performed prior to barrier layer formation. As discussed above, the barrier layer may be formed by any suitable method including PVD, CVD and ALD methods. In a particular example, the barrier layer is deposited by a PVD process. As discussed above, PVD processes may be preferred in some applications to deposit high quality, low-resistance films. Suitable barrier layer materials include, but are not limited to, tantalum, tantalum nitride, tungsten, titanium tungsten, titanium nitride, tungsten nitride, and combinations of these.

In operation 303, the substrate is transferred to the metal seed deposition module or chamber. The metal seed deposition module is a vacuum chamber that is capable of depositing the metal seed layer. In some embodiments, a suitable PVD apparatus employs a magnetic array for electron confinement to generate a high density plasma. The magnetic array may be implemented as one or more electromagnets, permanent magnets, or some combination of electromagnets and permanent magnets. The apparatus may include other magnets located proximate the substrate region for promoting process uniformity.

Examples of suitable apparatuses include hollow cathode magnetron (HCM) sputtering modules. Such apparatuses are described in further below as well as in U.S. Pat. Nos. 5,482,611; 6,179,973; 6,193,854; and 6,217,716, each of which is incorporated herein by reference for all purposes. Other types of sputtering apparatuses that may be used in accordance with the invention include planar magnetron sputtering modules. If the seed layer to be deposited is copper, a copper target source is used. Also, as described below, the apparatus typically employs a RF biased electrostatic chuck pedestal, which secures the wafer and applies an RF bias on the wafer, if needed.

After transfer to the metal seed deposition module, a sputter etch is performed to remove oxide and/or overhang from the diffusion barrier in operation 305, prior to the main metal seed deposition operation, which occurs in operation 307.

In conventional PVD processes, metal seed layer deposition occurs directly after the substrate is transferred to the copper PVD chamber. An inert gas is introduced to the chamber to form a plasma, the energetic ions of which bombard and eject copper atoms from the target to deposit on the substrate. In the method shown in FIG. 3, sputter etch is performed in the metal seed PVD module, prior to the main seed deposition. In certain embodiments, the sputter etch removes barrier layer oxide, which as explained above improves metal seed-barrier layer adhesion. Performing the sputter etch in the metal seed PVD module (rather than, for example, in a barrier layer PVD module) ensures that oxide formation will not occur between the sputter etch and metal seed layer deposition.

As indicated above, the sputter etch removes barrier oxide that has formed prior to the etchback. This improves the continuity and adhesion of the seed layer. If diffusion barrier overhang is present, the sputter etch also removes the overhang material. As indicated above, PVD deposition of diffusion barrier tends to produce films with overhang. The etch operation decreases the preplating aspect ratio, thereby decreasing the likelihood of void formation during electroplating. The etchback operation also reduces feature roughness, particularly on the sidewalls.

Process conditions during the sputter etch and metal seed deposition (operations 305 and 307, respectively, in FIG. 3) are such that there is a net etch in operation 305 and net deposition in operation 307. Etch/deposition (E/D) ratios for every step may be controlled by tuning the power to the source as well as the RF bias that may be applied to the substrate, as E/D ratio depends predominantly on the ratio of RF power (pedestal) to DC power (source).

In general, etch rate is most strongly related to the RF power, while the deposition rate is most strongly related to the DC source power. Higher RF/DC power ratios correspond to higher E/D ratios on the wafer, which can go to infinity if no DC power is applied to the target. Pure etching is achieved in this case. The etch rate is largely dependent on RF power and pressure since these parameters control the energy of argon ions near the wafer. The deposition rate is largely dependent on DC power since this parameter affects the flux and energy of argon ions near the sputter target.

As indicated, during the etchback step the combination of DC power applied to the target and RF power applied to the wafer has to ensure the net material removal from the wafer. For example, for HCM modules having target areas of between about 1000-6000 $cm^2$. DC power should be in the range from 1 kW to 10 kW or as low as 0 as indicated above for the pure etching. One of skill in the art will understand that this range depends on the target area, and can be different for smaller or bigger targets especially if the method is used with the different source/target design. The RF power may be between about 100 W to 3000 W for a typical substrate (e.g., a 300 mm wafer). This range depends on the wafer area and can be much greater for applications that deal with big substrates. In terms of power density (independent of the target area or substrate area), examples of suitable DC power ranges for the sputter etch operation are range from about 0 W/(cm$^2$ target) to 5 W/(cm$^2$ target) and for the RF power, from about 0.1 W/(cm$^2$ substrate) to 5 W/(cm$^2$ substrate).

After the sputter etch in operation 305, the metal seed layer is deposited in operation 307. Process conditions in operation 307 are such that there is a net deposition, rather than a net etch as in operation 305. Examples of suitable DC power ranges for the seed layer deposition operation are range from about 5 W/(cm$^2$ target) to 25 W/(cm$^2$ target), and, for the RF power, from about 0 W/(cm$^2$ substrate) to 0.5 W/(cm$^2$ substrate). PVD deposition of metal seed layers is described in U.S. Pat. Nos. 6,905,959; 6,773,571; and 6,642,146, which patents are hereby incorporated by reference and for all purposes. After the seed layer is deposited, the recessed features are filled with the conductive metal by electroplating in an operation 309.

In certain embodiments, it is desirable for the inert gas sputter flux in operation 307 to be accompanied by a small deposition flux. In typical HCM operation mode the pedestal capacitive RF discharge feeds on electrons created by the source at relatively low DC power (e.g., 0.1 W/(cm$^2$ target)–5 W/(cm$^2$ target)). Thus, the strong flux of argon or other inert gas ions to the wafer is accompanied by the small flux of copper (or other metal) species to the wafer. As a result, copper atoms are embedded into the barrier surface. These embedded atoms create nucleation centers for the subsequent seed layer deposition in operation 307. The copper atoms may be embedded to the depth of a few lattice constants from the surface into the barrier, depending on their energy. These nucleation centers promote seed film growth, film stability and improve the seed-barrier adhesion. Nucleation density during seed layer deposition also increases. The increased nucleation density results in film having less stress and better crystallographic orientation and texture. The feature edge roughness decreases.

It should be noted that while the sputter etch and metal seed layer deposition operations occur in the same chamber in the process illustrated in FIG. 3 (so that oxide will not form between the operations and/or to activate the barrier layer surface), in certain embodiments, the etchback operation may be performed outside the copper deposition module to remove overhang.

In a particular embodiment, tantalum-based barriers are used for copper metallization (e.g., a TaN/Ta/Cu stack). Tantalum-based barriers are particularly useful as barriers in copper metallization due to the absence of tantalum-copper intermetallic reactions, which means that the copper-tantalum interface is stable. However, this lack of chemical bonds in the interface also means that copper-tantalum adhesion may be a problem under conventional deposition processes described above (although copper does have relatively better adhesion to tantalum compared to many other materials considered for their barrier properties).

As a result copper agglomerates on the tantalum surface at elevated temperatures (as the copper-copper bond is stronger than the tantalum-copper bond). Because of this, the copper seed deposition is typically conducted at low substrate temperatures to suppress agglomeration by "freezing" the deposited copper atoms in place where they are adsorbed. Low temperature deposition reduces adsorbed atom mobility, thereby decreasing agglomeration and increasing nucleation density. However, the film quality is not as good as it would be if the film is grown at thermodynamic equilibrium conditions. As a result film grown at low temperature conditions is stressed. Copper dewetting at the interface and void formation usually accompanies the subsequent stress relaxation at higher temperature anneal processes. Seed layer deposition on tantalum by conventional methods may also present difficulties because tantalum oxidizes very easily. The tantalum oxide bond is strong, making the surface less attractive to subsequent copper seed deposition.

As indicated, the methods of the present invention may be used to improve copper seed deposition on tantalum-based barriers by allowing the copper seed to be deposited on an oxide-free surface thereby improving adhesion, and increasing nucleation density, thereby improving film continuity, reducing film stress, and as a result reducing post CMP defects as well as stress migration and electromigration at the Ta—Cu interface. In certain embodiments, the temperature at which the copper seed layer is deposited may be higher than the low temperatures at which the seed deposition typically occurs, resulting in improved adhesion and reduced stress in the film. For example, deposition temperatures ranging from about 2° C. to about 100 C may be used. One of skill in the art will recognize that the various benefits discussed above with regard to Ta-based/Cu stacks may also apply to various other barrier layer-seed layer combinations.

Apparatus

As indicated above, any suitable deposition apparatus appropriate for performing the sputter etch and metal seed deposition operations may be used, including PVD apparatuses that use hollow cathode magnetron (HCM) or planar magnetron targets.

Figure 4:
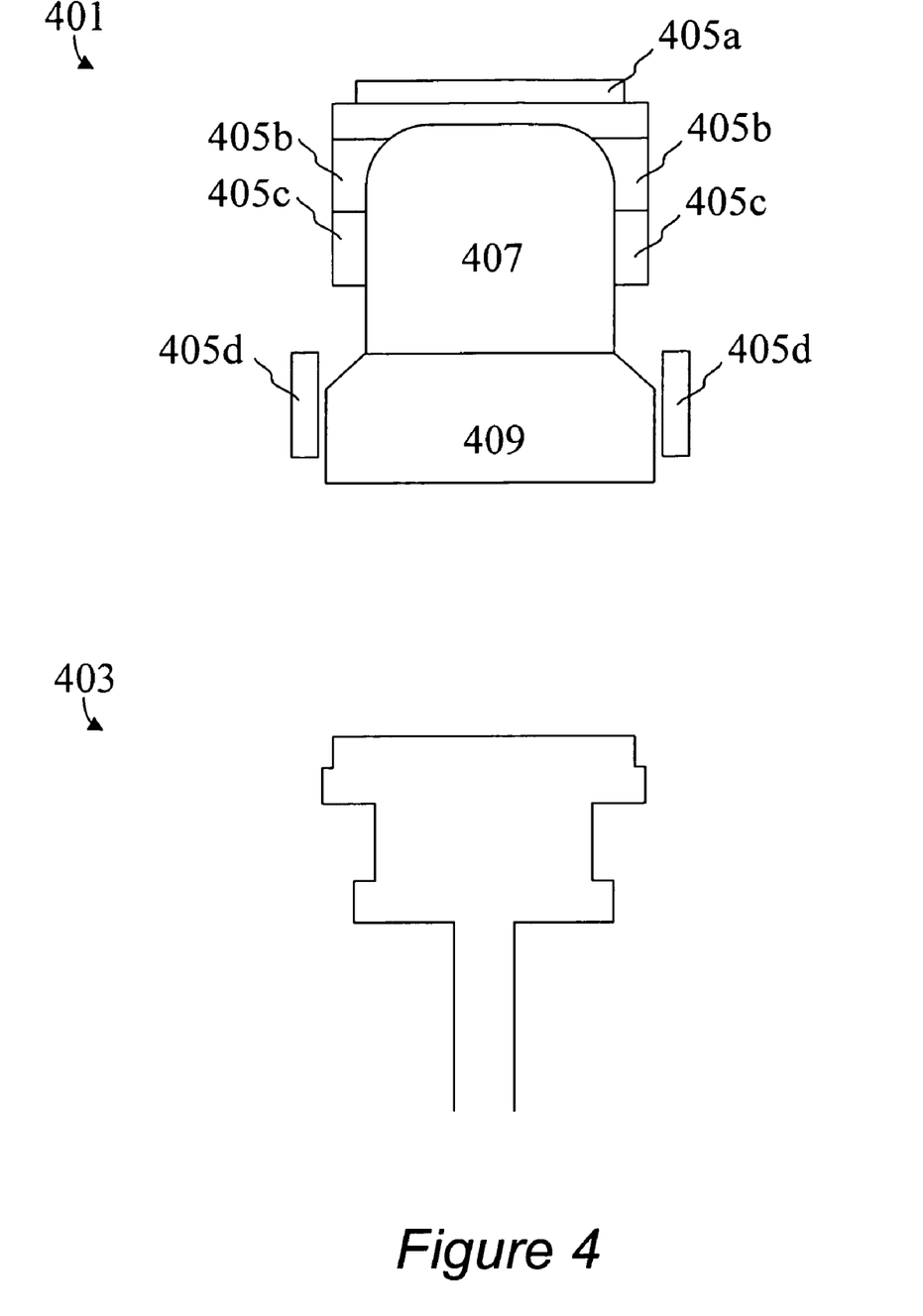
FIG. 4 is a cross-sectional depiction of a hollow cathode magnetron (HCM) apparatus suitable for practicing the current invention.

FIG. 4 presents a simple cross sectional view of one type of HCM sputtering apparatus that can be used in accordance with the invention. The HCM apparatus has two main components, the source 401, in which plasma is created and maintained, and the RF bias electrostatic chuck (ESC) pedestal 403, which secures the wafer and applies an RF bias on the wafer, if needed. In this specific example, the source 401 contains four electromagnets 405a-405d, a cathode target 407 and an anode 409. The cathode target 407 generally has a hollow cup-like shape so that plasma formed in the source can be concentrated within this hollow region. The cathode target 407 also serves as a sputter target and is, therefore, made of a metal material such as copper or aluminum, which is to be deposited onto a substrate.

An inert gas, such as argon, is introduced to into the hollow region of the cathode target 407 to form plasma. An intense magnetic field is produced by electromagnets 405a-405d within the cathode target region. Additional electromagnets are arranged downstream of the cathode target so that different currents can be applied to each electromagnet, thereby producing an ion flux and a controlled deposition and/or etch rate and uniformity. A metal spacer 409, typically held at plasma floating potential, is used, in conjunction with the source electromagnets to shape the plasma distribution at the target mouth. The RF bias ESC pedestal 403 holds the wafer substrate in place and can apply a RF bias to the wafer substrate. The ion energy, and therefore the deposition and/or etch rate can also be controlled by the pedestal RF bias. Typically, the amount of sputtering is controlled by the RF power at fixed RF frequency. Various RF frequencies can be used to achieve this effect. One preferred RF frequency is 13.56 MHz. An additional function of the ESC pedestal is to provide wafer temperature control during sputter etch and deposition. Typically, argon backside gas is used to provide thermal coupling between the substrate and the ESC. In many cases, the ESC is cooled during deposition.

As well, various aspects of process flows involve deposition of barrier materials (by ALD, CVD or PVD) as well as precleaning, and degassing operations. In these embodiments all these process steps are done in the same processing tool. Tools that allow degas, ALD or CVD deposition, and PVD deposition all under the same vacuum are the INOVA and INOVA NExT deposition systems available from Novellus Systems of San Jose, Calif. These systems are comprised of processing modules, e.g. for Degas, Cool, Preclean, PVD, CVD or ALD processes, mounted to the same wafer handling module. Therefore, once a wafer is in the tool and a vacuum is established, all of the above described process aspects are performed. In particular embodiments, the barrier layer deposition occurs in a tantalum (or other barrier material) PVD deposition module, with the wafer then transferred to the metal seed PVD deposition module for sputter etch and metal seed deposition.

Process Conditions

As discussed above with regard to FIG. 3, the RF bias power and DC source power are important process conditions to control sputter etch and metal seed deposition operations.

During the sputter etch operation, DC power typically ranges from about 0.5 W/(cm$^2$ target) to 5 W/(cm$^2$ target), but it could be as low as 0 for the pure etching, and RF power, from about 0.1 W/(cm$^2$ substrate) to 5 W/(cm$^2$ substrate). DC power is typically higher during the deposition operation than for the sputter etch operation. DC power typically ranges from about 15 W/(cm$^2$ target) to 25 W/(cm$^2$ target), and RF power, from about 0 W/(cm$^2$ substrate) to 0.5 W/(cm$^2$ substrate) for the deposition step.

Plasma reactors that allow fine control of the plasma conditions can be tuned to provide the E/D variations over substrate topology as may be desired. For example, the INOVA HCM reactors provided by Novellus Systems have eight or more separate electromagnetic coils. Fine tuning the E/D profile from via bottom to field region and from the center to edge across of the wafer by independently controlling each of these coils is described in U.S. Pat. No. 6,764,940, which is hereby incorporated by reference.

Other process conditions include temperature, pressure and inert gas flow rate. Temperatures typically range from about −40 C to 50 C for both the sputter etch operation and for the deposition operation. As discussed above, conventional copper seed deposition operations use very low substrate temperatures (e.g., less than about 50 C) in order to reduce adsorbed atom mobility. In certain embodiments, methods of the present invention may use higher substrate temperatures during seed deposition, thereby decreasing film stress. Pressures typically range from about 1E−3 Torr to 1E−2 Torr for the sputter etch operation and about 5E−5 Torr to 5E−3 Torr for the deposition operation, and argon flow rates range from about 10 sccm to 200 sccm for the sputter etch operation and about 0 sccm (gas-free operation) to 20 sccm for the deposition operation. One of skill in the art will understand that these are exemplary ranges that may be need to be adjusted depending on the substrate and apparatus used.

EXPERIMENTAL

TaN/Ta barriers were deposited by PVD on wafers using INOVA xT deposition systems available from Novellus Systems of San Jose. The barriers were deposited in trenches of 100 nm. After barrier deposition the wafers were transferred to the copper deposition PVD module. An etchback process was performed in the copper deposition module, prior to deposition of the copper seed layer.

Resistivity

Resistivity drift of the deposited Cu film over time is an indication that the film undergoes a re-crystallization process. The more the drift the more stressed film was deposited. Such a film is more likely to relieve the stress over time, which leads to microvoid formation and subsequently failures related to stress-migration or electro-migration mechanisms. Film deposited on the barrier without an air break has a relatively small resistivity drift of 4% over a long time. If there is an air break after Ta deposition, the barrier oxidizes and subsequently deposited Cu film has a resistivity drift of 14% over time.

Such an oxidized barrier was subjected to the etchback step in the copper module before copper deposition. Resistivity drift of the Cu film was reduced back to 4%-showing that the effects of barrier oxidation were eliminated and the barrier-seed interface became stable again. The etchback step was performed using a DC power of 0.6 W/cm$^2$ and a RF power of 1.2 W/cm$^2$ for 10 s.

Elimination of Overhang

Figure 5A:
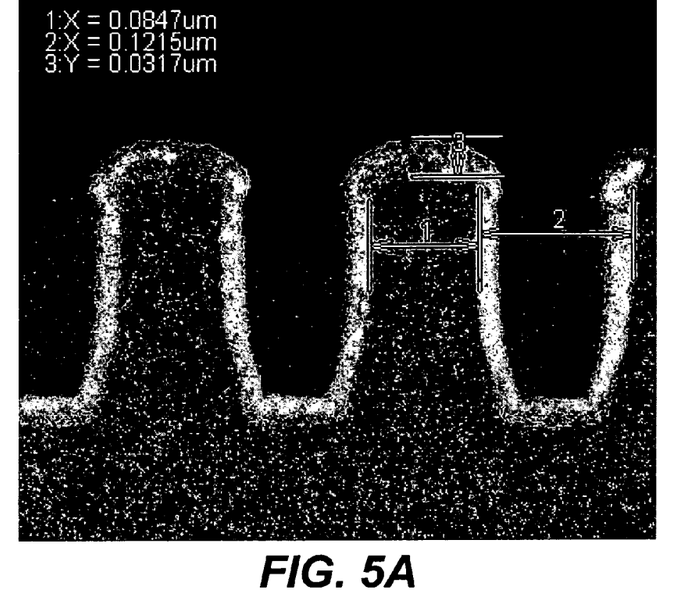
FIG. 5A shows the structure prior to barrier layer etchback.
Figure 5B:
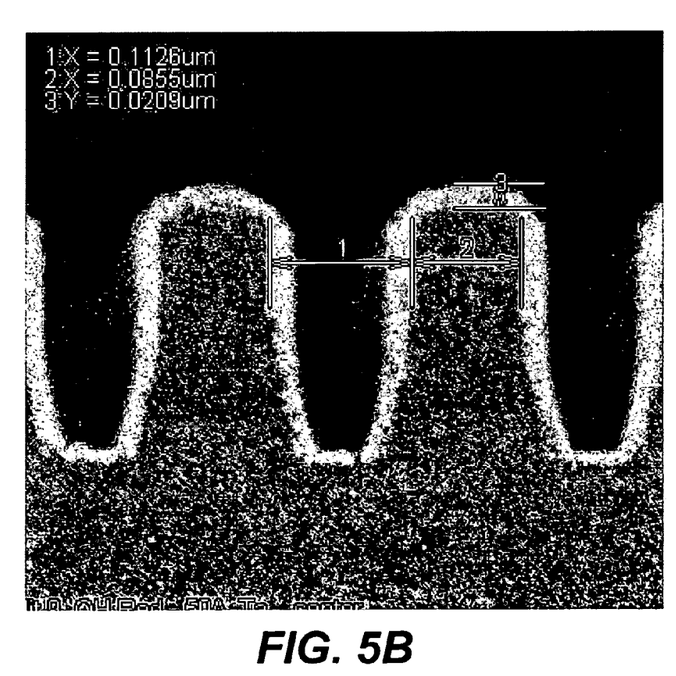
FIG. 5B shows the structure after an etchback was performed.

FIG. 5A is an image showing the barrier layer formation 501 observed on the wafer after barrier deposition (prior to any etchback process). As can be seen from the figure, barrier layer overhang is present and notches the tops of the feature, creating an umbrella-like shape. FIG. 5B shows the barrier layer observed after the proposed etchback. As can be seen from the figure, the barrier overhang notch is eliminated. Barrier material at the corners of the top of the features is clipped. The bottom of the barrier is intact after the etchback.

Process conditions for the sputter etch are given below. For comparison, process conditions used for subsequent copper seed layer deposition are also shown.

|  | DC Power (kW) | RF Power (W) | Ar Flow (sccm) | Pressure (Torr) | Temperature (° C.) |
| --- | --- | --- | --- | --- | --- |
| Etch | 1.5 | 900 | 130 | 4.00E−3 | −40 |
| Deposition | 70 | 0 | 4 | 1.00E−4 | −40 |

As discussed above, the etch step uses a significantly higher RF power and lower DC power as compared to the etch step. In addition, pressure is significantly higher. Both these factors lead to the higher plasma density in vicinity of the wafer compare to the target area and controlled bias on the wafer to achieve high E/D ratio.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of depositing a metal conductive seed layer on a substrate comprising:

a) providing a substrate having a barrier layer in a recessed feature deposited thereon to a seed layer deposition chamber;

b) performing an inert gas sputter etch of at least the sidewalls of the barrier layer in the seed layer deposition chamber;

c) depositing the metal conductive seed layer over the surface of the wafer substrate in the seed layer deposition chamber.

2. The method of claim 1 wherein the sputter etch removes barrier material that overhangs the recessed feature on the substrate.

3. The method of claim 1 wherein the seed layer is a copper seed layer.

4. The method of claim 1 wherein the barrier layer comprises tantalum.

5. The method of claim 1 further comprising simultaneously sputtering metal atoms from a target while performing the sputter etch of the barrier material.

6. The method of claim 5 wherein the metal atoms become embedded within the barrier layer during the sputtering process.

7. The method of claim 6 wherein the embedded metal atoms are nucleation sites for the seed layer deposition in (c).

8. The method of claim 1 wherein (b) comprises sputtering a metal from target having an applied DC power of between about 0 and 10 kW while applying a RF bias to the wafer substrate.

9. The method of claim 1 wherein (b) comprises applying a RF bias of at least about 100 W to the substrate.

10. The method of claim 1 wherein the seed layer deposition chamber comprises a HCM.

11. The method of claim 1 wherein the seed layer deposition chamber comprises a planar magnetron.

12. The method of claim 1 wherein further comprising, prior to (a), depositing the barrier layer on the substrate.

13. The method of claim 1 further comprising electroplating metal on the seed layer.

14. The method of claim 1 wherein the barrier layer provided in (a) has oxide formed thereon and wherein at least some of said oxide is removed during (b).

15. A method of depositing a metal seed layer on a semiconductor substrate having recessed features; the method comprising:

a) providing the substrate with a barrier layer in a recessed feature deposited thereon to the seed layer deposition chamber;

b) applying a DC power to a metal target within the chamber and an applied RF bias to the substrate to simultaneously etch at least the sidewalls of the barrier layer oxide and implant metal atoms into the barrier layer;

c) applying a DC power to the metal target to deposit a metal seed layer that substantially coats the sidewalls of the features, wherein the implanted seeds are nucleation sites for the deposition of the metal seed layer.

16. The method of claim 15 wherein (b) further comprises sputtering excess barrier material from the tops of the features.

17. The method of claim 15 wherein the substrate undergoes a vacuum break between deposition of the barrier layer and deposition of the seed layer.

18. The method of claim 15 wherein the DC power applied in (b) is between about 0 and 5 W/cm2.

19. The method of claim 15 wherein the RF power applied in (b) is between about 0.1 and 5 W/cm2.

20. The method of claim 15 further comprising, prior to (a), depositing the barrier layer by a sputtering process.

21. The method of claim 20 wherein therein the substrate undergoes a vacuum break between deposition of the barrier layer and providing the substrate to the deposition chamber.

22. The method of claim 20 wherein therein the substrate does not undergo a vacuum break between deposition of the barrier layer and providing the substrate to the deposition chamber.

23. The method of claim 15 wherein the pressure during b) ranges from 1e−3 to 1e−2 Torr and the pressure during c) ranges from 5e−5 to 5e−3 Torr.

24. The method of claim 1 wherein the seed layer deposition chamber comprises a wafer support to support a wafer and a metal seed target located in proximity to the wafer support such that when sputtered from the target, metal seed material is deposited on a wafer supported by the wafer support.

* * * * *